(12) United States Patent
Kawazu

(10) Patent No.: US 11,758,648 B2
(45) Date of Patent: *Sep. 12, 2023

(54) HIGH-FREQUENCY BOARD, HIGH-FREQUENCY PACKAGE, AND HIGH-FREQUENCY MODULE

(71) Applicant: KYOCERA Corporation, Kyoto (JP)

(72) Inventor: Yoshiki Kawazu, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 107 days.

This patent is subject to a terminal disclaimer.

(21) Appl. No.: 17/394,152

(22) Filed: Aug. 4, 2021

(65) Prior Publication Data

US 2021/0368616 A1 Nov. 25, 2021

Related U.S. Application Data

(63) Continuation of application No. 16/088,258, filed as application No. PCT/JP2017/012371 on Mar. 27, 2017, now Pat. No. 11,102,880.

(30) Foreign Application Priority Data

Mar. 30, 2016 (JP) ................................. 2016-067616

(51) Int. Cl.
*H05K 1/02* (2006.01)
*H05K 1/16* (2006.01)

(52) U.S. Cl.
CPC ........... *H05K 1/0251* (2013.01); *H05K 1/162* (2013.01)

(58) Field of Classification Search
CPC .... H05K 1/0253; H05K 1/025; H05K 1/0218; H05K 1/0219; H05K 1/0224; H05K 1/023; H05K 1/181–184; H05K 1/0251; H05K 1/162

See application file for complete search history.

(56) References Cited

U.S. PATENT DOCUMENTS

| | | | |
|---|---|---|---|
| 7,183,491 B2 | 2/2007 | Ishikawa | |
| 7,186,926 B2 | 3/2007 | Maeno | |
| 8,115,568 B2 | 2/2012 | Hsu | |
| 8,680,403 B2 * | 3/2014 | Howard | H05K 1/0253 174/262 |
| 10,524,347 B2 | 12/2019 | Berkel | |

(Continued)

FOREIGN PATENT DOCUMENTS

| | | |
|---|---|---|
| JP | 50-013471 B | 5/1975 |
| JP | 2001-044644 A | 2/2001 |

(Continued)

*Primary Examiner* — Hoa C Nguyen

(74) *Attorney, Agent, or Firm* — Volpe Koenig

(57) ABSTRACT

A high-frequency board includes an insulating substrate, a first line conductor, a second line conductor, a capacitor, a first bond, and a second bond. The insulating substrate has a recess on its upper surface. The first line conductor extends from an edge of the recess on the upper surface of the insulating substrate. The second line conductor faces the first line conductor across the recess on the upper surface of the insulating substrate. The capacitor overlaps the recess. The first bond joins the capacitor to the first line conductor. The second bond joins the capacitor to the second line conductor, and is spaced from the first bond.

17 Claims, 12 Drawing Sheets

(56) References Cited

U.S. PATENT DOCUMENTS

| | | | |
|---|---|---|---|
| 2005/0225408 A1* | 10/2005 | Yagisawa | H01P 1/203 |
| | | | 333/24 C |
| 2006/0018104 A1 | 1/2006 | Katayama et al. | |
| 2006/0279371 A1 | 12/2006 | Sato et al. | |
| 2010/0177489 A1* | 7/2010 | Yagisawa | H01P 3/081 |
| | | | 361/752 |

FOREIGN PATENT DOCUMENTS

| | | |
|---|---|---|
| JP | 2005-050974 A | 2/2005 |
| JP | 2006-032783 A | 2/2006 |
| WO | 2009/119443 A1 | 10/2009 |
| WO | 2015/162768 A1 | 10/2015 |

* cited by examiner

HIGH-FREQUENCY BOARD, HIGH-FREQUENCY PACKAGE, AND HIGH-FREQUENCY MODULE

CROSS REFERENCE TO RELATED APPLICATION

This application is a continuation of U.S. patent application Ser. No. 16/088,258, filed on Sep. 25, 2018, which claims benefit of Japanese Patent Application No.: 2016/067616, filed on Mar. 30, 2016 which claims benefit of International Patent Application PCT/JP2017/012371, the entire contents of which are incorporated herein by reference in their entireties.

FIELD

The present invention relates to a high-frequency board, a high-frequency package including the high-frequency board, and a high-frequency module.

BACKGROUND

As wireless communication devices including mobile phones are widely used, these devices have increasingly higher frequencies to transmit increasingly larger volumes of information at an increasingly higher speed. A known high-frequency board includes a capacitor located between portions of a signal line to remove the DC voltage component that transmits high-frequency signals (refer to WO 2009/119443).

A high-frequency board described in WO 2009/119443 includes a dielectric substrate, a signal line arranged on a surface of the dielectric substrate to transmit signals, and a capacitor mounted on a portion separating the signal line on the surface of the dielectric substrate to electrically connect the separated ends of the signal line.

The capacitor is mounted on the surface of the dielectric substrate, and joined to the substrate with an electrically conductive bond, such as solder. When an increasingly smaller and shorter capacitor is joined to the substrate with such a bond, the bond can extend across and connect the separated ends of the signal line. The separated portions of the signal line may be electrically connected through the bond and may be short-circuited.

BRIEF SUMMARY

Technical Problem

A high-frequency board according to one aspect of the present invention includes an insulating substrate, a first line conductor, a second line conductor, a capacitor, a first bond, and a second bond. The insulating substrate has a recess on its upper surface. The first line conductor extends from an edge of the recess on the upper surface of the insulating substrate. The second line conductor faces the first line conductor across the recess on the upper surface of the insulating substrate. The capacitor overlaps the recess. The first bond joins the capacitor to the first line conductor. The second bond joins the capacitor to the second line conductor. The second bond is spaced from the first bond.

A high-frequency package according to another aspect of the present invention includes a board, a frame, and the high-frequency board according to one embodiment of the present invention. The frame with a through-hole surrounds an upper surface of the board. The high-frequency board is mounted in the through-hole.

A high-frequency module according to still another aspect of the present invention includes the high-frequency package according to one embodiment of the present invention, a semiconductor element, and a lid. The semiconductor element is mounted on the upper surface of the board. The lid is joined to an upper edge of the frame to cover the high-frequency package.

DETAILED DESCRIPTION

A high-frequency board according to an embodiment of the present invention will now be described with reference to the drawings.

High-Frequency Board Structure

Figure 1:
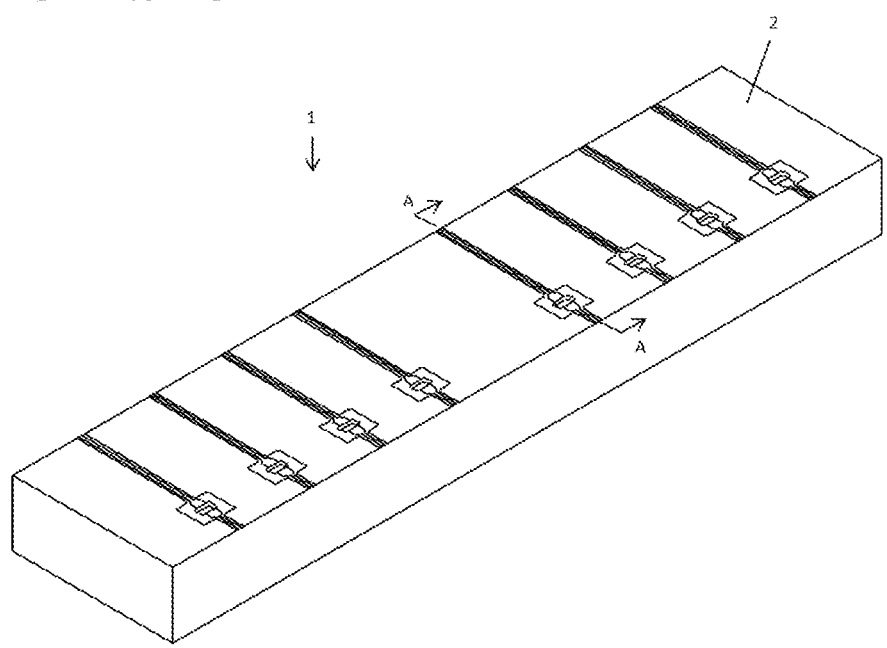
FIG. 1 is a perspective view of a high-frequency board (with no capacitor) according to an embodiment of the present invention.
Figure 2:
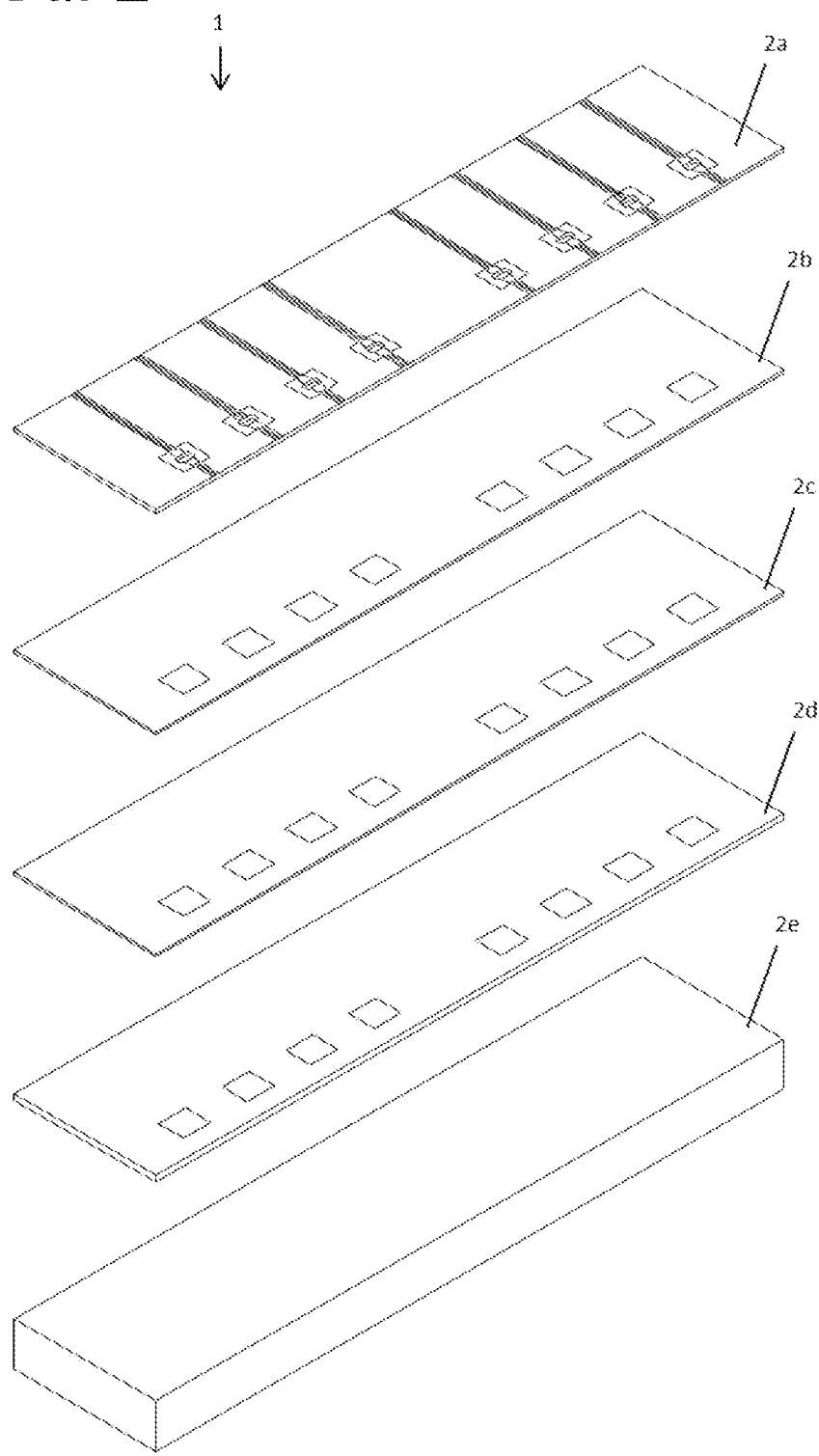
FIG. 2 is an exploded perspective view of the high-frequency board (with no capacitor) according to the embodiment of the present invention.
Figure 3:
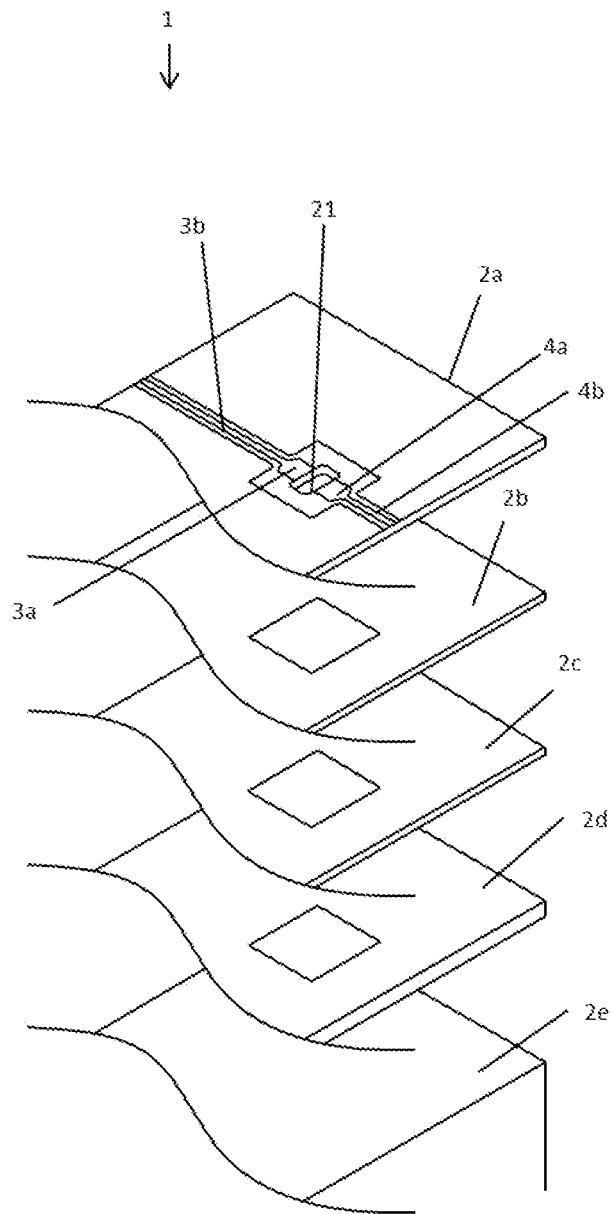
FIG. 3 is an enlarged view of a main part of the high-frequency board (with no capacitor) according to the embodiment of the present invention.
Figure 4A:
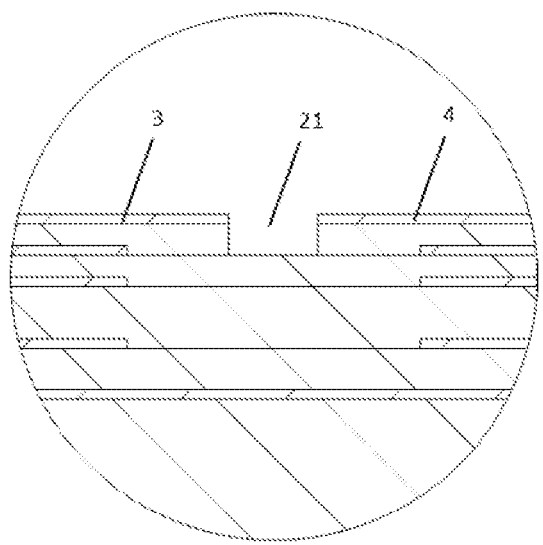
FIGS. 4A to 4C are cross-sectional views of the high-frequency board (with no capacitor) according to the embodiment of the present invention taken along line A-A of FIG. 1, having a rectangular recess in FIG. 4A, a tapered recess in FIG. 4B, and a stepped recess in FIG. 4C.
Figure 4B:
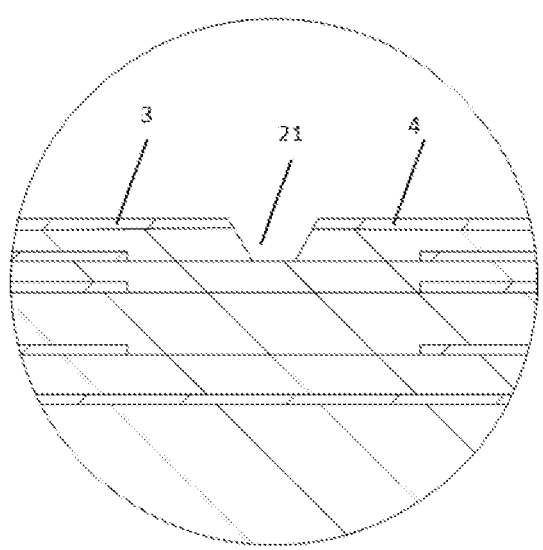
Figure 4C:
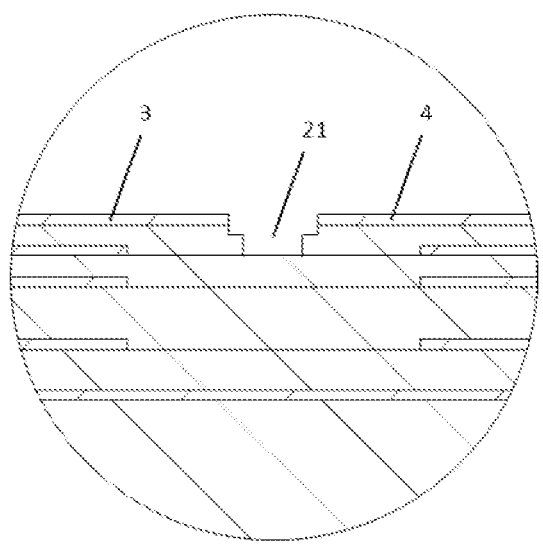
Figure 5:
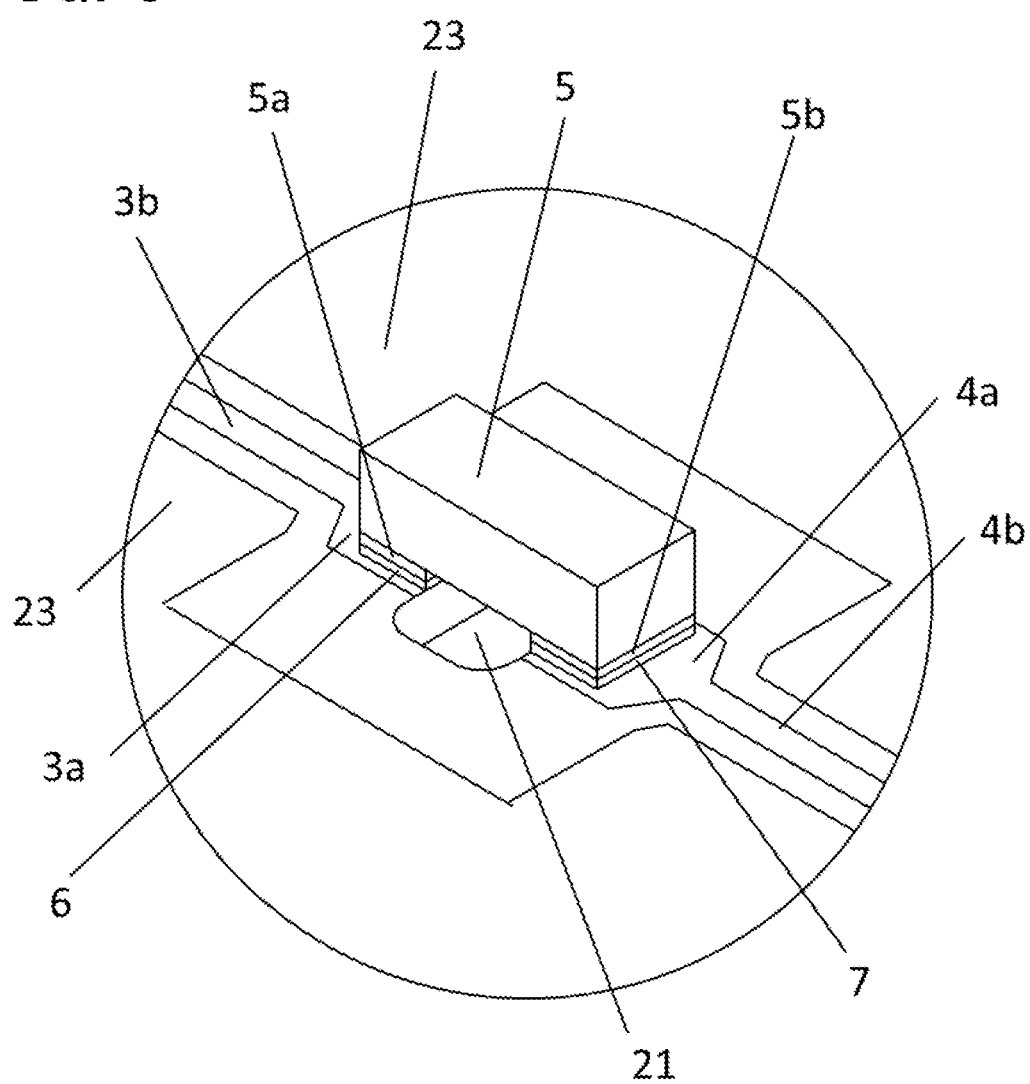
FIG. 5 is an enlarged view of a main part of the high-frequency board according to the embodiment of the present invention.
Figure 6:
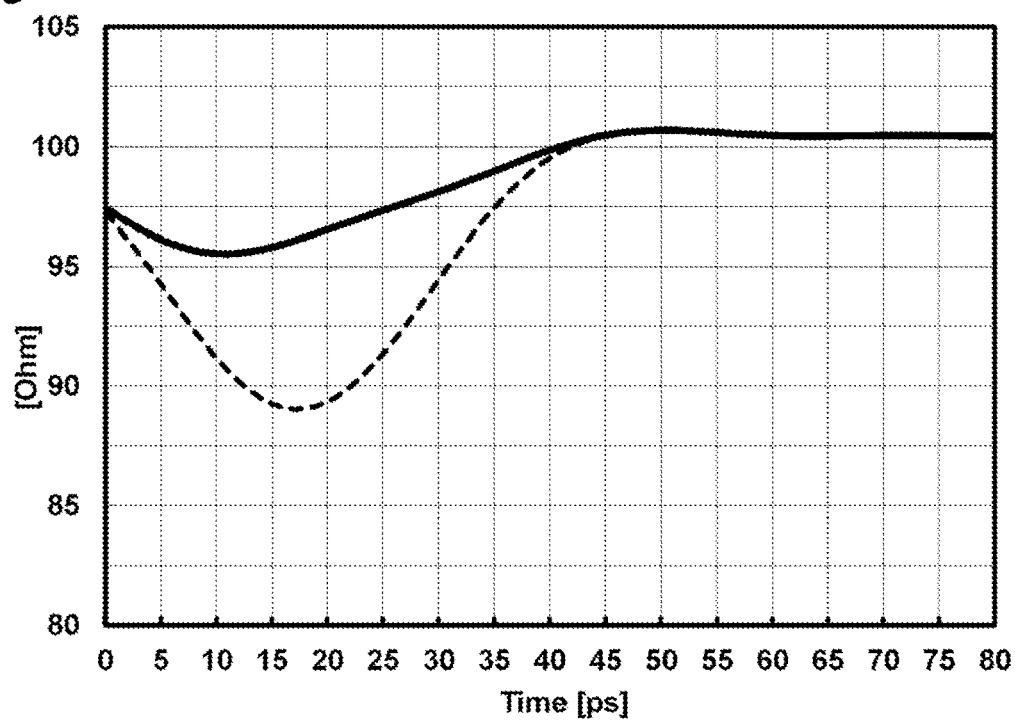
FIG. 6 is a graph showing the impedance of the high-frequency board according to the embodiment of the present invention.
Figure 7:
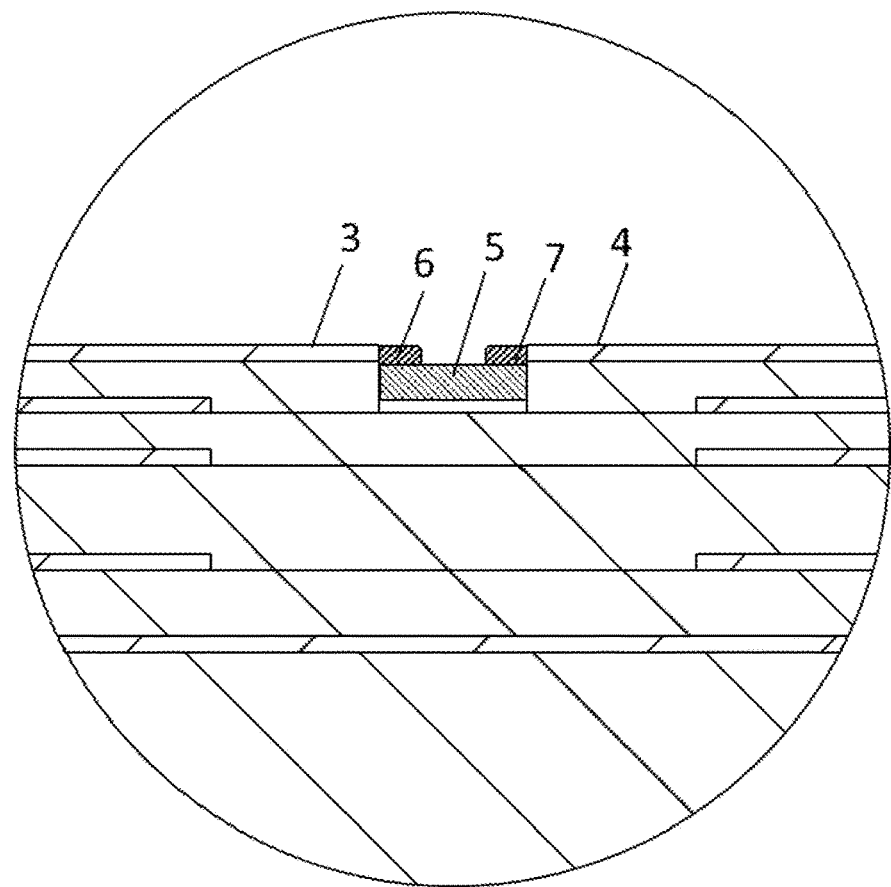
FIG. 7 is a cross-sectional view of a high-frequency board according to another embodiment having the same structure as the high-frequency board of the embodiment of the present invention except including an embedded capacitor.

FIG. 1 is a perspective view of a high-frequency board 1 according to an embodiment of the present invention. FIGS. 2 and 3 are exploded perspective views of the high-frequency board 1 according to the embodiment of the present invention. FIGS. 4A to 4C are cross-sectional views of the high-frequency board 1 according to the embodiment of the present invention taken along line A-A of FIG. 1. FIG. 5 is an enlarged view of a main part of the high-frequency board according to the embodiment of the present invention. FIG. 6 is a graph showing the impedance of the high-frequency board according to the embodiment of the present invention. FIG. 7 is a cross-sectional view of a high-frequency board according to another embodiment with the same structure as the high-frequency board of the above embodiment except having an embedded capacitor. In the figures, the high-frequency board 1 includes an insulating substrate 2, a first line conductor 3, a second line conductor 4, a capacitor 5, a first bond 6, and a second bond 7.

As shown in FIGS. 1 and 2, the insulating substrate 2 is a laminate of insulating layers 2a, 2b, 2c, 2d, and 2e formed from dielectric substances. The insulating substrate 2 is, for example, rectangular, with the dimensions of 4×8 mm to 15×30 mm as viewed from above and a height of 1 to 10 mm. Each insulating layer in the insulating substrate 2 is formed from a dielectric material. Examples of the dielectric material include ceramic materials such as sintered aluminum oxide, sintered mullite, sintered silicon carbide, sintered aluminum nitride, and sintered silicon nitride, as well as glass ceramic materials.

The insulating substrate 2 has an upper surface (surface on which the capacitor 5 is to be mounted) having a recess 21 formed through the insulating layer 2a. The recess 21 is, for example, rectangular as viewed from above with the dimensions of 0.2×0.4 mm to 2×10 mm. As viewed from above, the recess 21 may also be elliptical or square, or may be rectangular but have round corners. The recess 21 is, for example, rectangular in a cross-sectional view with the dimensions of 0.1×0.2 mm to 5×10 mm. In other words, the recess 21 has a depth of 0.1 to 5 mm. The recess 21 may also be, for example, rectangular, tapered, flared, or stepped in a cross-sectional view.

The insulating layers 2b, 2c, 2d, and 2e each have, on their upper surfaces, multiple ground conductors around the positions overlapping the recesses 21 and at the positions overlapping the first line conductor 3 and the second line conductor 4. These ground conductors are electrically connected vertically through, for example, vias. In FIG. 2, the squares indicate the positions overlapping the recesses 21, which are surrounded by the ground conductors. The lower surface of the insulating substrate 2, or the lower surface of the insulating layer 2e, is covered by a lower surface ground conductor layer. The lower surface ground conductor layer, which is also electrically connected with the ground conductors on the insulating layers through, for example, vias, serves as a reference potential.

The lower surface ground conductor layer is, for example, rectangular as viewed from above with the dimensions of 0.1×0.2 mm to 2×10 mm. The lower surface ground conductor layer is formed from, for example, a metal material such as tungsten, molybdenum, or manganese.

As shown in FIG. 3, the upper surface of the insulating substrate 2, or the upper surface of the insulating layer 2a has the first line conductor 3 extending from an edge of the opening of the recess 21 away from the recess 21. The first line conductor 3 includes a first electrode pad 3a, to which a first electrode 5a of the capacitor 5 is to be connected, and a first line 3b extending from the first electrode pad 3a away from the recess 21. As viewed from above, for example, the first electrode pad 3a is 0.2 to 2 mm long, and 0.2 to 2 mm wide, and the first line 3b is 0.5 to 20 mm long in a direction parallel to the direction in which high-frequency signals are transmitted, and is 0.05 to 20 mm wide in a direction perpendicular to the direction in which high-frequency signals are transmitted. The first electrode pad 3a and the first line 3b are both 0.01 to 0.1 mm thick. The first electrode pad 3a and the first line 3b are formed from, for example, a metal material such as gold, silver, copper, nickel, tungsten, molybdenum, or manganese, and may be formed on the surface of the insulating layer 2a as a metallization layer by co-firing or metal plating.

The first electrode pad 3a overlaps at least the lower surface ground conductor layer and the ground conductors on the insulating layers. The first line 3b also overlaps at least the lower surface ground conductor layer and the ground conductors on the insulating layers. This structure allows the first electrode pad 3a and the first line 3b to form a strip line structure with the lower surface ground conductor layer and the ground conductors on the insulating layers. This facilitates transmission of high-frequency signals.

The insulating substrate 2 or the insulating layer 2a has, on its upper surface, the second line conductor 4 extending from an edge of the opening of the recess 21 away from the recess 21. The second line conductor 4 includes a second electrode pad 4a, to which a second electrode 5b of the capacitor 5 is to be connected, and a second line 4b extending from the second electrode pad 4a away from the recess 21. The second electrode pad 4a faces the first electrode pad 3a across the recess 21 as viewed from above. As viewed from above, for example, the second electrode pad 4a is 0.2 to 2 mm long, and 0.2 to 2 mm wide, and the second line 4b is 0.5 to 20 mm long in a direction parallel to the direction in which high-frequency signals are transmitted, and 0.05 to 20 mm wide in a direction perpendicular to the direction in which high-frequency signals are transmitted. The second pad 4a and the second line 4b are both 0.01 to 0.1 mm thick. The second electrode pad 4a and the second line 4b are formed from, for example, a metal material such as gold, silver, copper, nickel, tungsten, molybdenum, or manganese, and may be formed on the surface of the insulating layer 2a as a metallization layer by co-firing, or metal plating.

The second electrode pad 4a overlaps at least the lower surface ground conductor layer and the ground conductors on the insulating layers. The second line 4b also overlaps at least the lower surface ground conductor layer and the ground conductors on the insulating layers. This structure allows the second electrode pad 4a and the second line 4b to form a strip line structure with the lower surface ground conductor layer and the ground conductors on the insulating layers. This facilitates transmission of high-frequency signals.

As shown in FIG. 5, the capacitor 5 is arranged across the first line conductor 3 and the second line conductor 4 to overlap the recess 21. The first electrode 5a of the capacitor 5 is electrically connected and fixed to the first electrode pad 3a through the first bond 6, and the second electrode 5b of the capacitor 5 is electrically connected and fixed to the second electrode pad 4a through the second bond 7. The capacitor 5 is, for example, rectangular as viewed from above, with the dimensions of 0.3×0.4 mm to 2×4 mm and a height of 0.3 to 2 mm. The capacitor 5 is formed from, for example, forsterite, aluminum oxide, barium magnesium niobate, or barium neodymium titanate. The arrangement of the capacitor 5 across the first line conductor 3 and the second line conductor 4, and being electrically connected and fixed to the first line conductor 3b and the second line conductor 4b removes the DC current component from high-frequency signals.

The first and second electrodes 5a and 5b are arranged on the lower surface of the capacitor 5 (surface facing the upper surface of the insulating substrate 2). The first electrode 5a is electrically connected and joined to the first electrode pad 3a through the first bond 6. The second electrode 5b is electrically connected and joined to the second electrode pad 4a through the second bond 7. The second bond 7 is spaced from the first bond 6 across the recess 21. The first bond 6 may be, for example, known solder such as Sn—Ag—Cu solder, Sn—Zn—Bi solder, or Sn—Cu solder. Similarly, the second bond 7 may be one of various types of solder such as Sn—Ag—Cu solder, Sn—Zn—Bi solder, or Sn—Cu solder.

The first and second bonds 6 and 7 are spaced from each other across the recess 21 between the first and second electrode pads 3a and 4a. The recess 21 can leave the space between the first and second bonds 6 and 7 despite any excessive amounts of the first and second bonds 6 and 7. This structure reduces the likelihood of contact between the first and second bonds 6 and 7. To downsize the high-frequency board 1 and the capacitor 5, the first and second electrode pads 3a and 4a may be arranged closer to each other. This can increase the likelihood of contact between the first and second bonds 6 and 7, thus causing unintended connection or short-circuiting between them. However, the recess 21 between the first and second electrode pads 3a and 4a can reduce the likelihood of such contact between the first and second bonds 6 and 7 and enables the high-frequency board 1 as well as the capacitor 5 to be downsized.

The first and second electrode pads 3a and 4a each may be, for example, spaced from the ends of the opening of the recess 21. The recess 21 thus further reduces the likelihood of contact between the first and second bonds 6 and 7.

The recess 21 has round corners as viewed from above. The recess 21 can thus reduce stress around the recess 21 locally concentrating during the manufacture of the insulating substrate 2, or when the capacitor 5 is joined to the first and second electrode pads 3a and 4a through the first and second bonds 6 and 7.

The recess 21 is longer in a direction perpendicular to the direction in which the first and second electrode pads 3a and 4a are aligned. The recess 21 can thus reduce stress at the joint between the capacitor 5 and the first electrode pad 3a through the first bond 6, and the stress at the joint between the capacitor 5 and the second electrode pad 4a through the second bond 7 interacting each other when the capacitor 5 is joined to the first and second electrode pads 3a and 4a through the first and second bonds 6 and 7.

The recess 21 is longer in the direction perpendicular to the direction in which the first and second electrode pads 3a and 4a are aligned than the capacitor 5 in the same direction (the width of the capacitor 5). The recess 21 can thus further reduce the likelihood of contact between the first and second bonds 6 and 7.

The first line 3b and the second line 4b are narrower in a direction perpendicular to the direction in which the first and second electrode pads 3a and 4a are aligned than the first and second electrode pads 3a and 4a in the same direction. The capacitor 5 is firmly joined to the first and second electrode pads 3a and 4a through the first and second bonds 6 and 7.

The capacitor 5 having the recess 21 at the bottom (in the direction toward the insulating substrate 2) has a space to reduce the likelihood of the electrostatic capacities increasing between the first and second electrode pads 3a and 4a, between the first and second electrodes 5a and 5b, and between the first and second bonds 6 and 7. The space can also reduce the likelihood of the impedance decreasing as the electrostatic capacities increase. Thus, the high-frequency board 1 according to the embodiment of the present invention can adjust the impedance between the first and second electrode pads 3a and 4a through the capacitor 5 and the first and second bonds 6 and 7 to an intended value.

Such impedance matching is shown experimentally in the graph of FIG. 6. The graph compares changes in impedance along the transmission line corresponding to the period in which high-frequency signals are transmitted between the structure with the recess 21 and the structure without the recess 21. In the graph, the horizontal axis indicates time and the vertical axis indicates the impedance of transmitted signals. The broken line shows the results for the structure without the recess 21 on the upper surface of the insulating substrate 2, and the solid line shows the results for the structure with the recess 21 on the upper surface of the insulating substrate 2. In the graph in FIG. 6, for example, the impedance of the high-frequency signal transmission line has a predetermined value of $100\Omega$ between the first line conductor 3 and the second line conductor 4 through the first and second electrode pads 3a and 4a and the capacitor 5. Without the recess 21, the impedance rapidly decreased to less than or equal to $90\Omega$ between 15 to 20 ps at the transmission line where the capacitor 5 is mounted. However, with the recess 21, the impedance was maintained greater than or equal to $95\Omega$ at around 10 ps, where the impedance was the lowest. In other words, this structure reduces the likelihood of the impedance changing largely. The impedance thus deviates less from the predetermined value.

The structure described above allows the high-frequency board 1 with the recess 21 to leave the space between the first and second bonds 6 and 7 despite any excessive amounts of the first and second bonds 6 and 7. This reduces the likelihood of contact between the first and second bonds 6 and 7. In other words, the high-frequency board 1 can transmit high-frequency signals in good conditions.

To downsize the high-frequency board 1 and the capacitor 5, the first and second electrode pads 3a and 4a may be arranged closer to each other. This can increase the likelihood of contact between the first and second bonds 6 and 7, thus causing unintended connection or short-circuiting between the first line conductor 3 and the second line conductor 4. The recess 21 between the first and second electrode pads 3a and 4a can reduce the likelihood of such contact between the first and second bonds 6 and 7 and enables the high-frequency board 1 as well as the capacitor 5 to be downsized further, unlike the structure without the recess 21.

The first and second electrodes 5a and 5b are arranged on the lower surface and the side surfaces of the two ends of the capacitor 5. The first electrode 5a arranged on the side surface of one end of the capacitor 5 is electrically connected and fixed to the first electrode pad 3a through the first bond 6, and the second electrode 5b arranged on the side surface of the other end of the capacitor 5 is electrically connected and fixed to the second electrode pad 4a through the second bond 7. When the first and second electrodes 5a and 5b are each continuously arranged on the lower surface and the side surfaces of the two ends of the capacitor 5, the capacitor 5 can be firmly connected and fixed to the first and second electrode pads 3a and 4a. With a lower end portion of the capacitor 5 partially fitted in the recess 21, the first and second electrodes 5a and 5b arranged on the side surfaces of the two ends of the capacitor 5 can be connected and fixed to the first and second electrode pads 3a and 4a.

In this case, the high-frequency board 1 has a height lower by the depth of the lower end portion of the capacitor 5 partially fitted in the recess 21 than when the capacitor 5 is arranged above the first and second electrode pads 3a and 4a (adjacent to the capacitor 5). To allow the capacitor 5 to partially fit in the recess 21, the recess 21 is tapered or stepped in a cross-sectional view. A lower end portion of the capacitor 5 is fitted in the recess 21 to easily create a space under the capacitor 5 (adjacent to the high-frequency board 1).

The high-frequency board 1 according to embodiments of the present invention has the first and second electrode pads 3a and 4a each continuously arranged on the upper surface of the insulating substrate 2 to the two sides of the recess 21. The capacitor 5 is thus more firmly connected and fixed to the first and second electrode pads 3a and 4a through the first and second bonds 6 and 7. This reduces the likelihood of the capacitor 5 breaking or separating when the high-frequency board 1 receives stress.

As shown in FIG. 7, the first and second electrodes 5a and 5b may be arranged also on the upper surface of the two ends of the capacitor 5 as well as on the lower surface and the side surfaces of the two ends of the capacitor 5. With the same advantage as described above, the capacitor 5, with the electrodes arranged on its upper surface as well as on its lower surface and the side surfaces of the two ends, can be more firmly connected and fixed to the first and second electrode pads 3a and 4a through the first and second bonds 6 and 7. With a lower end portion of the capacitor 5 partially fitted in the recess 21 as described above, the first and second electrodes 5a and 5b arranged on the upper surface as well as on the lower surface and the side surfaces of the two ends of the capacitor 5 can be connected and fixed to the first and second electrode pads 3a and 4a through the first and second bonds 6 and 7.

In other words, the capacitor 5 can be electrically connected and fixed to the first and second electrode pads 3a and 4a to have its upper surface lower than the upper surface of the insulating substrate 2 with the first and second electrode pads 3a and 4a. In this case, the high-frequency board 1 can have a height lower by the height of the capacitor 5 than when the capacitor 5 is arranged on the upper surface of the insulating substrate 2. When the capacitor 5 is fitted in the recess 21, the recess 21 is tapered or stepped in a cross-sectional view as described above to create a space under the capacitor 5 fitted in the recess 21.

Figure 8:
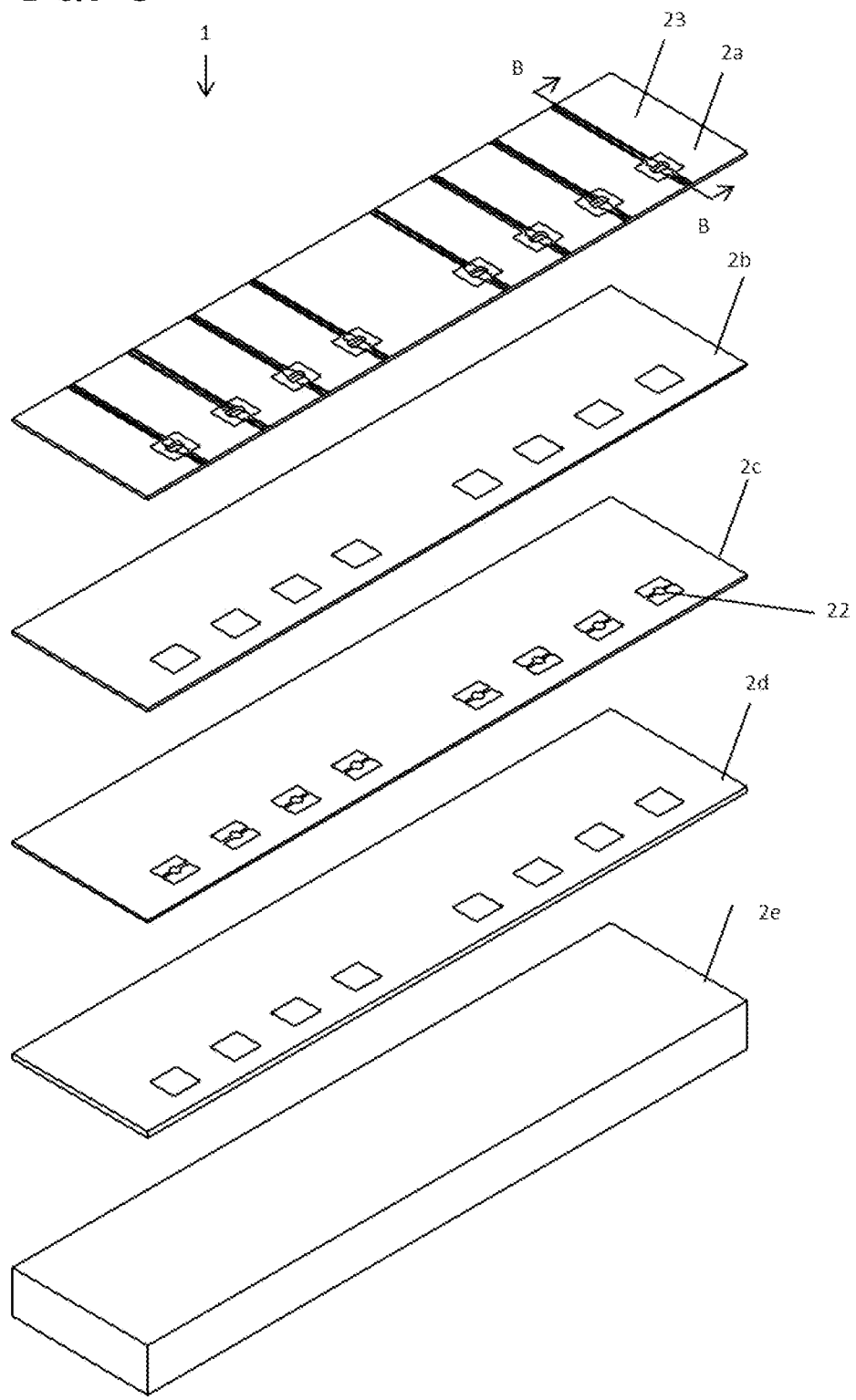
FIG. 8 is an exploded perspective view of the high-frequency board (with no capacitor) according to the other embodiment of the present invention.
Figure 9:
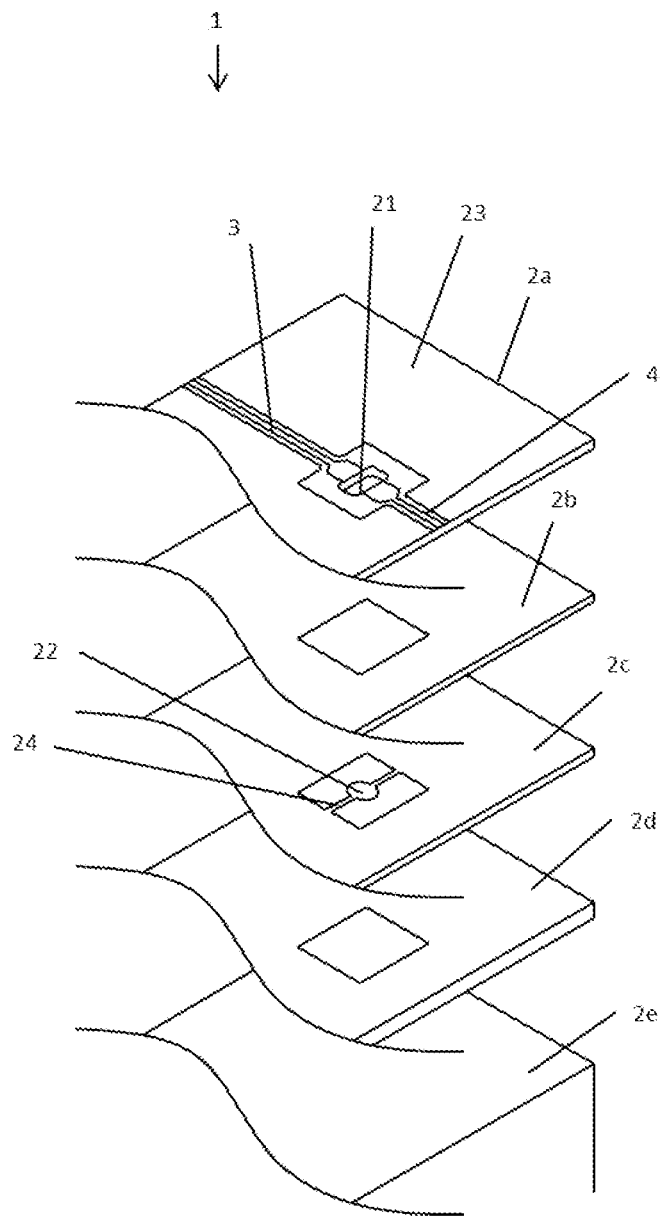
FIG. 9 is an enlarged view of a main part of the high-frequency board (with no capacitor) according to the other embodiment of the present invention.
Figure 10A:
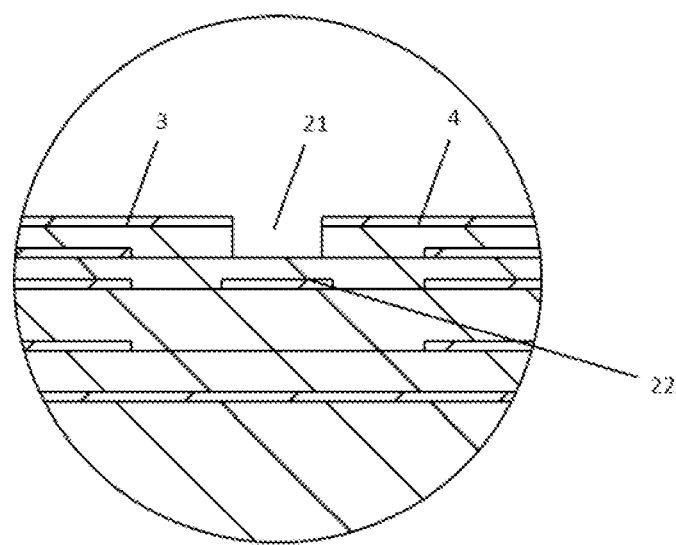
FIGS. 10A to 10C are cross-sectional views of an uppermost layer to a lowermost layer of the high-frequency board (with no capacitor) according to the other embodiment of the present invention taken along line B-B of FIG. 8, having a rectangular recess in FIG. 10A, a tapered recess in FIG. 10B, and a stepped recess in FIG. 10C.
Figure 10B:
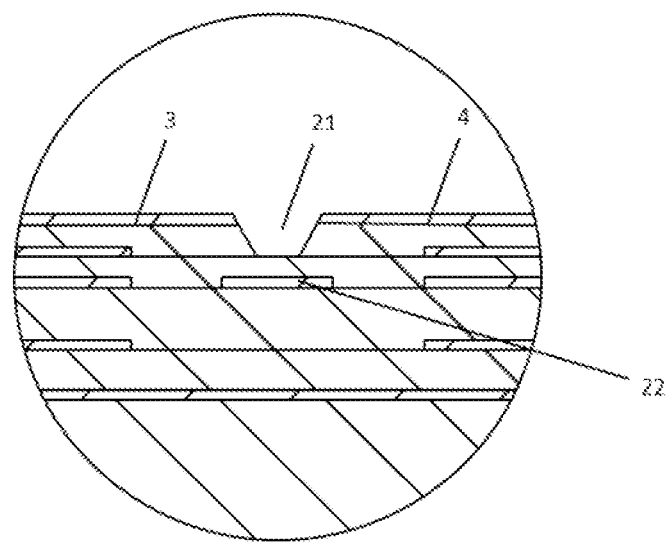
Figure 10C:
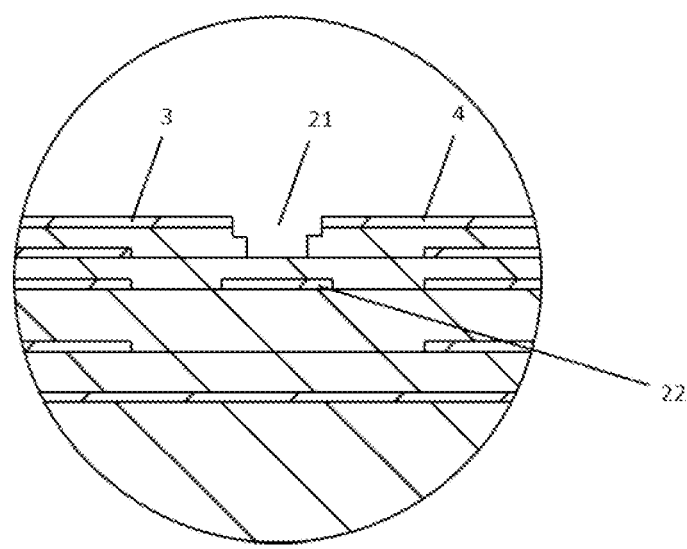

FIG. 8 is an exploded perspective view of the high-frequency board 1 according to another embodiment of the present invention. FIG. 9 is an enlarged exploded perspective view of a main part of the high-frequency board 1 according to the other embodiment of the present invention. FIGS. 10A to 10C are cross-sectional views of the high-frequency board 1 according to the other embodiment of the present invention taken along line B-B of FIG. 8. In the figures, the high-frequency board 1 according to the above other embodiment of the present invention differs from the high-frequency board 1 according to the above embodiment of the present invention in that the high-frequency board 1 according to the above other embodiment further includes an internal ground conductor layer 22 at a position overlapping the recess 21. The internal ground conductor layer 22 has its edges overlapping the first and second electrode pads 3a and 4a as viewed from above.

As shown in FIGS. 8 to 10C, the first ground conductor layer 22 is arranged inside the insulating substrate 2, or specifically on the upper surface of the insulating layer 2c (surface facing the insulating layer 2b). The first ground conductor layer 22 is, for example, elliptical as viewed from above, and is partially connected to the ground conductor around it through a connecting line conductor 24. The elliptical area has the dimensions of 0.3×0.4 mm to 2×8 mm. The first ground conductor layer 22 is shaped partially circular and rectangular.

Thus, the high-frequency board 1 according to the embodiment of the present invention can reduce cracks forming inside the insulating substrate 2. Also, the first ground conductor layer 22 may be, for example, arranged linearly continuous with the connecting line conductor 24 as viewed from above. Thus, the high-frequency board 1 according to the embodiment of the present invention can reduce stress inside the insulating substrate 2.

The first ground conductor layer 22 and the connecting line conductor 24 are formed from, for example, a metal material such as tungsten, molybdenum, or manganese, and may be formed on the upper surface of the insulating layer 2c as a metallization layer by co-firing. In particular, the first ground conductor layer 22 with curved edges like an ellipse as viewed from above can have less drastic changes in impedance between the first and second electrode pads 3a and 4a than the first ground conductor layer 22 that is rectangular as viewed from above. This reduces insertion loss or reflection loss during transmission of high-frequency signals between the first and second electrode pads 3a and 4a through the capacitor 5 and the first and second bonds 6 and 7.

As shown in FIGS. 8 and 9, the first ground conductor layer 22 overlaps the recess 21. This structure further strengthens the electric field coupling between the capacitor 5 and the ground conductor arranged around the capacitor 5 during transmission of high-frequency signals through the capacitor 5 than the structure without the first ground conductor layer 22, thus reducing resonance possibly when the electric field distribution expands more than intended during transmission of high-frequency signals. With the electric field coupling with the first ground conductor layer 22, high-frequency signals can be smoothly transmitted through the capacitor 5.

The first ground conductor layer 22 is arranged to allow the edges of the layer 22 to overlap the first and second electrode pads 3a and 4a. Like the advantage described above, this arrangement can strengthen the electric field coupling between the first and second electrode pads 3a and 4a and the ground conductors arranged around the first and second electrode pads 3a and 4a when high-frequency signals are transmitted through the first and second electrode pads 3a and 4a. This can reduce resonance possibly when the electric field distribution expands more than intended during transmission of high-frequency signals. With the electric field coupling with the first ground conductor layer 22, high-frequency signals can be smoothly transmitted through the first and second electrode pads 3a and 4a.

As shown in FIG. 8, the first ground conductor layer 22 is electrically connected to the ground conductor through the connecting line conductor 24. Further, for example, the ground conductors arranged on the upper surfaces of the insulating layers 2b, 2c, and 2d are electrically connected through, for example, vias formed vertically through the insulating layers.

As shown in FIGS. 1 to 3 and 5, and FIGS. 8 and 9, second ground conductor layers 23 are arranged on the upper surface of the insulating layer 2a with the recess 21, the first line conductor 3, the second line conductor 4, and the capacitor 5 between them. The second ground conductor layers 23 are arranged on the two sides of the first line conductor 3 and the second line conductor 4, forming a coplanar line. This can strengthen the electric field coupling more than the strip line structure. This also reduces expansion of the electric field, facilitating transmission of high-frequency signals.

The high-frequency board 1 according to the above other embodiment of the present invention accommodates electronic components electrically connected to the first and second electrode pads 3a and 4a across the recess 21. The electronic components include a resistor, an inductor, and beads in addition to the capacitor 5. The recess 21 creates a space between the electrodes of the electronic components to reduce the effect of the electrostatic capacities between the electronic components and the insulating layers 2b, 2c, 2d, and 2e, allowing the transmission line of high-frequency signals to have an intended impedance.

Method for Manufacturing High-Frequency Board

The insulating substrate 2 including the insulating layers 2a, 2b, 2c, 2d, and 2e formed from, for example, sintered aluminum oxide may be prepared in the manner described below. An aluminum oxide-containing powdery raw material is mixed with, for example, an appropriate organic binder and an appropriate solvent to form slurry. The slurry is then shaped into sheets using, for example, the doctor blade method, to yield multiple ceramic green sheets. The uppermost ceramic green sheet has a through-hole, which is to be the recess 21.

The multiple ceramic green sheets are then cut or punched into an appropriate shape, and then stacked on one another and pressure-bonded. The stacked ceramic green sheets are then fired at a temperature of 1500 to 1600° C. in a reducing atmosphere to complete the insulating substrate 2.

The first electrode pad 3a, the first line 3b, the second electrode pad 4a, the second line 4b, the first ground conductor layer 22, the second ground conductor layer 23, the connecting line conductor 24, and the ground conductors on the upper surfaces of the insulating layers are formed from, for example, a metallization layer, which may be formed from a metal having a high melting point, such as tungsten, molybdenum, or manganese, prepared in the manner described below. A metal powder with a high melting point is kneaded with an organic solvent and a binder fully into a metal paste. The metal paste is then printed at predetermined positions on the ceramic green sheets, to be the upper surfaces of the insulating layers 2a, 2b, 2c, 2d, and 2e, by, for example, screen printing. These layers are then co-fired with the ceramic green sheets. Through these processes, the metallization layers are applied to the upper surface and the interior of the insulating substrate 2 or between the insulating layers to serve as the first electrode pad 3a, the first line 3b, the second electrode pad 4a, the second line 4b, the first ground conductor layer 22, the second ground conductor layer 23, the connecting line conductor 24, and the ground conductors on the upper surfaces of the insulating layers.

The vias may be formed in the manner described below. Through-holes are first formed in the ceramic green sheets to be the insulating layers 2a, 2b, 2c, 2d, and 2e. The through-holes are filled with the same metal paste as for the first ground conductor layer 22, the second ground conductor layer 23, the connecting line conductor 24, and the ground conductors on the upper surfaces of the insulating layers. The metal paste is then co-fired with the ceramic green sheets. The through-holes can be formed by, for example, die machining using a metal pin, or punching, for example, with laser. The metal paste may be easily filled into the through-holes using, for example, vacuum suction.

The insulating substrate 2 has, for example, a wall 13 on its upper surface arranged on the first line conductor 3 or the second line conductor 4. The wall is formed from the same insulating material as the insulating substrate 2. Thus, the insulating substrate 2 is inserted and fixed to a through-hole 91 of a frame 9, which is formed from a metal member described later, while being insulated from, for example, the first line conductor 3, the second line conductor 4, and the frame 9.

High-Frequency Package Structure

Figure 11:
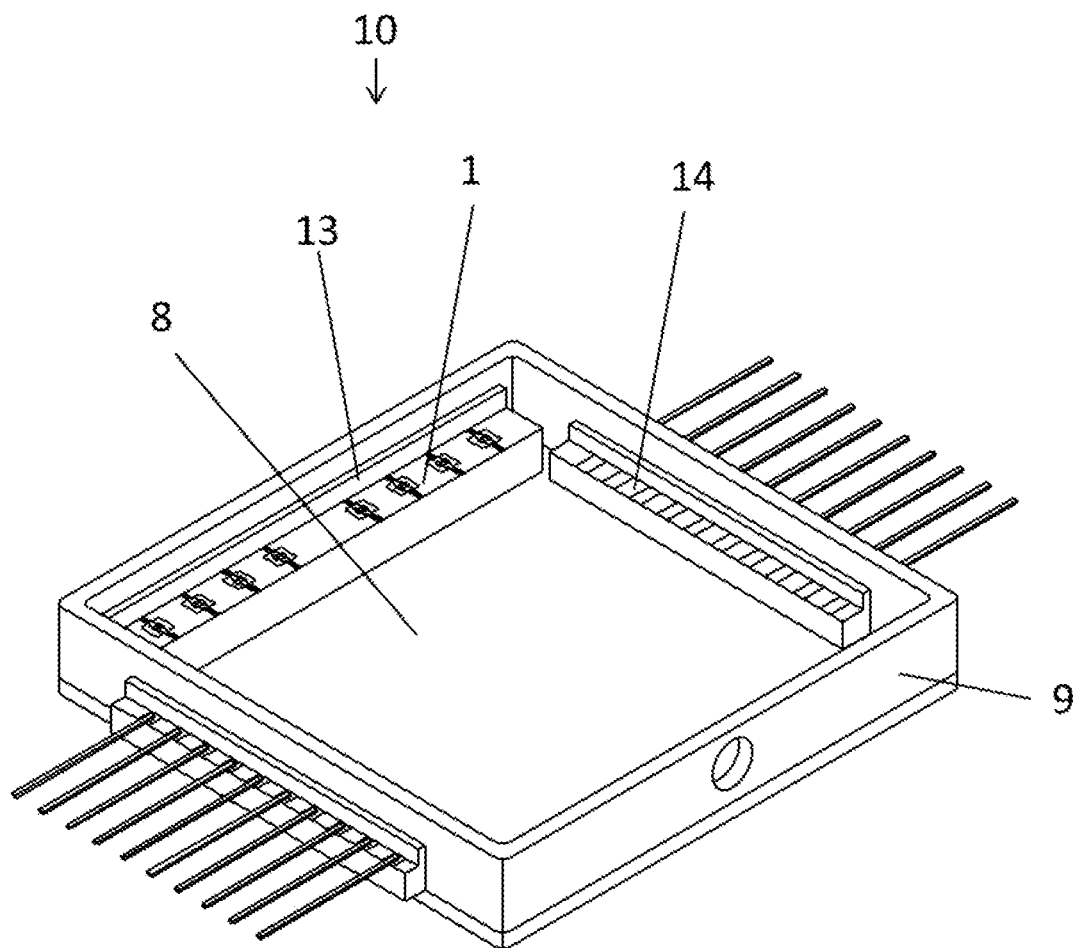
FIG. 11 is a perspective view of a high-frequency package according to an embodiment of the present invention.
Figure 12:
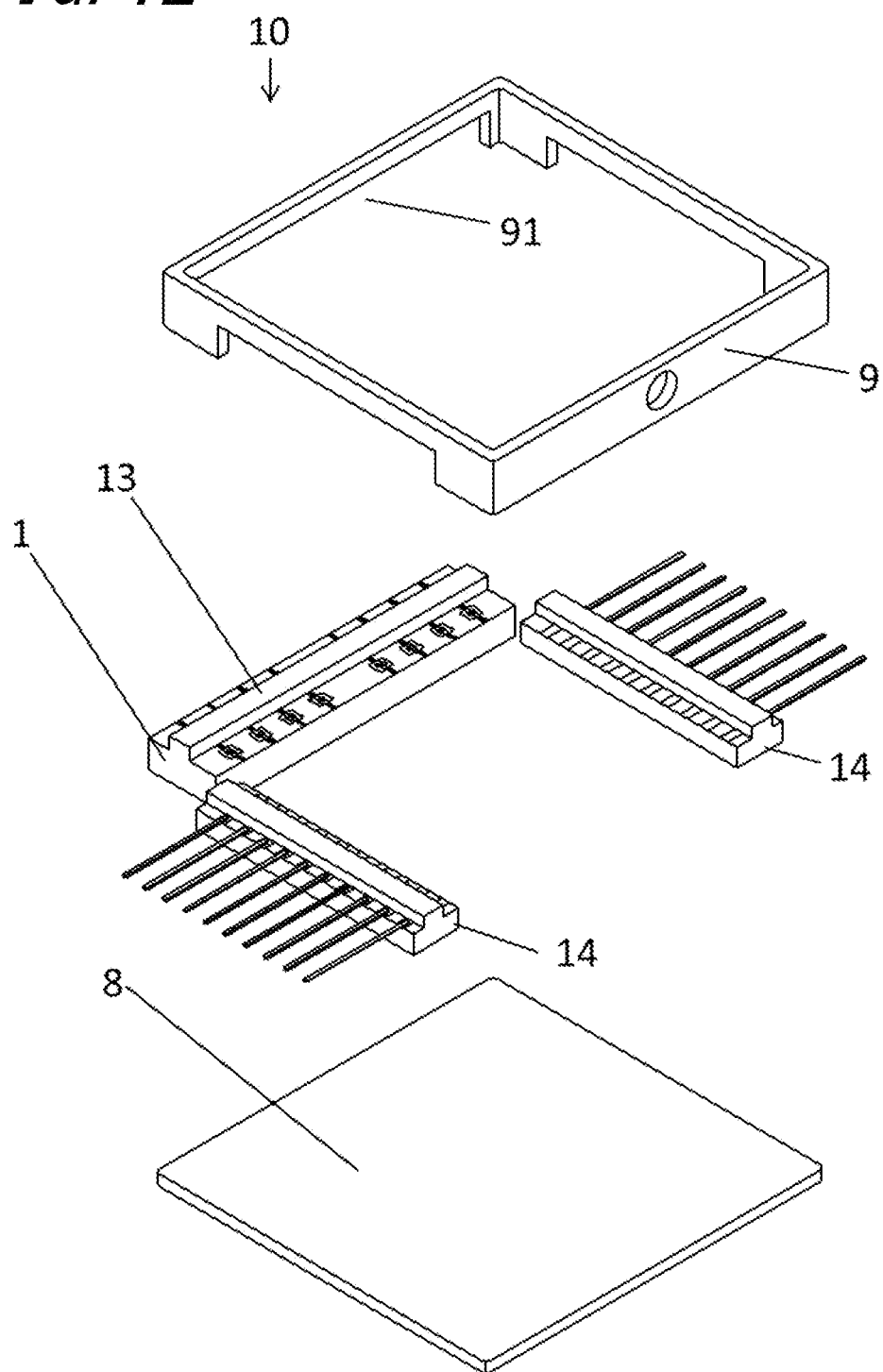
FIG. 12 is an exploded perspective view of the high-frequency package according to the embodiment of the present invention.

FIG. 11 is a perspective view of a high-frequency package 10 according to an embodiment of the present invention. FIG. 12 is an exploded perspective view of the high-frequency package 10 according to the above embodiment of the present invention. In the figures, the high-frequency package 10 includes a board 8, the frame 9, DC terminals 14 into which a DC voltage is input through lead members, and the high-frequency board 1 according to an embodiment of the present invention.

The board 8 is rectangular as viewed from above, with the dimensions of 10×10 mm to 50×50 mm and a height of 0.5 to 20 mm.

The frame 9 surrounds the upper surface of the board 8. The frame 9 is rectangular as viewed from above, with the dimensions of 10×10 mm to 50×50 mm and a height of 2 to 15 mm. The frame has a thickness of 0.5 to 2 mm.

The board 8 and the frame 9 may be formed from, for example, a metal such as iron, copper, nickel, chromium, cobalt, molybdenum, or tungsten, or an alloy of these metals, such as a copper-tungsten alloy, a copper-molybdenum alloy, or an iron-nickel-cobalt alloy. The metal member for the board 8 may be prepared by processing (e.g., rolling or punching) an ingot formed from such a metal material.

The frame 9 has through-holes 91 in its side walls. The high-frequency board 1 described above and DC terminals 14 are inserted into the through-holes 91 and fixed. In the high-frequency package 10, the high-frequency board 1 serves as input-output terminals for high-frequency signals, and the DC terminals 14 serve as terminals into which a DC voltage is input.

High-Frequency Module Structure

Figure 13:
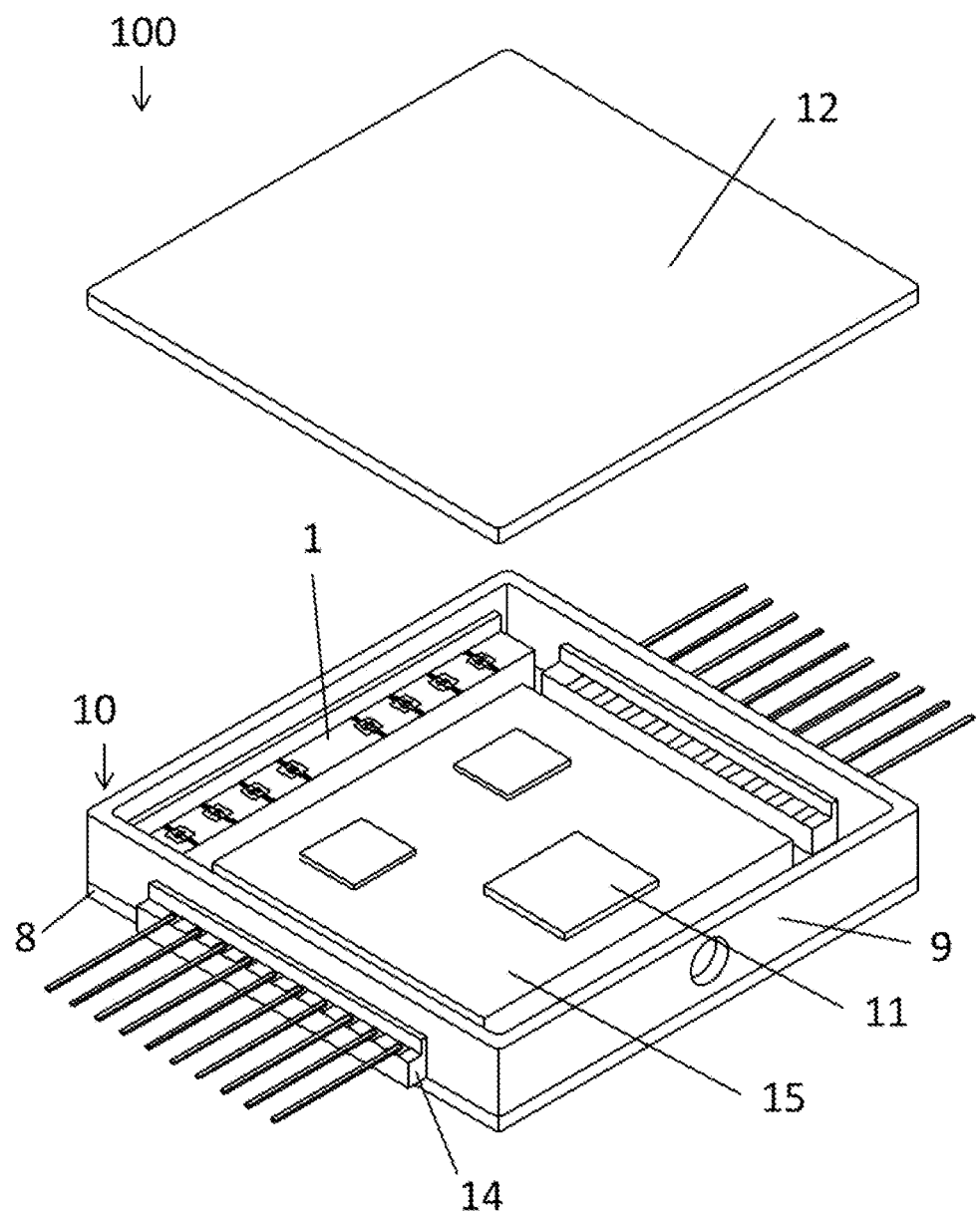
FIG. 13 is a perspective view of a high-frequency module according to an embodiment of the present invention.

FIG. 13 is a perspective view of a high-frequency module 100 according to an embodiment of the present invention. In the figure, the high-frequency module 100 includes the high-frequency package 10 according to an embodiment of the present invention, a semiconductor element 11, and a lid 12.

The semiconductor element 11 is, for example, a laser diode (LD). The semiconductor element 11 may be, for example, a photodiode (PD). The semiconductor element 11 is arranged on a wiring board 15, and electrically connected with an electrical connection member, such as solder or a bonding wire. For an LD semiconductor, another through-hole may be formed in the frame 9 to connect an optical fiber, in addition to the through-hole 91 through which the high-frequency board 1 is to be mounted.

The lid 12 is joined to the upper edge of the frame 9 to cover the high-frequency package 10. The lid 12 is rectangular as viewed from above, with the dimensions of 10×10 mm to 50×50 mm and a height of 0.5 to 2 mm. The lid 12 may be formed from, for example, a metal such as iron, copper, nickel, chromium, cobalt, molybdenum or tungsten, or an alloy of these metals, such as a copper-tungsten alloy, a copper-molybdenum alloy, or an iron-nickel-cobalt alloy. The metal member for the lid 12 may be prepared by processing (e.g., rolling or punching) an ingot formed from such a metal material.

The present invention is not limited to the above embodiments, but may be modified variously without departing from the spirit and scope of the invention. Modifications contained in the claims can fall within the scope of the present invention.

Reference Signs List
1 high-frequency board
2 insulating substrate
21 recess
22 first ground conductor layer
23 second ground conductor layer
24 connecting line conductor
3 first line conductor
3a first electrode pad
3b first line
4 second line conductor
4a second electrode pad
4b second line
5 capacitor
6 first bond
7 second bond
8 board
9 frame
91 through-hole
10 high-frequency package
11 semiconductor element
12 lid
13 wall
14 DC terminal
15 wiring board
100 high-frequency module

The invention claimed is:

1. A high-frequency board, comprising:
an insulating substrate including an upper surface and a recess extending in a first direction on the upper surface;
a first line conductor located on the upper surface of the insulating substrate;
a second line conductor facing the first line conductor with the recess therebetween on the upper surface of the insulating substrate; and
a ground conductor layer on the upper surface of the insulating substrate,
wherein the ground conductor layer extending along the first line conductor and the second line conductor so as to be spaced from the first line conductor and the second line conductor and so as to be spaced from the recess on both sides in the first direction of the recess, and
wherein the first direction is a direction different from an extension direction of the first line conductor and the second line conductor,
wherein in plan view, a first end of the first line conductor ends at a first side of the recess or the first end of the first line conductor is spaced from the first side, and a first end of the second line conductor ends at a second side of the recess or the first end of the second line conductor is spaced from the second side.

2. The high-frequency board according to claim 1, wherein the first line conductor comprises a first electrode pad, and a first line which extends from the first electrode pad,
the second line conductor comprises a second electrode pad, and a second line which extends from the second electrode pad, and
a distance between the first line and the ground conductor layer and a distance between the second line and the ground conductor layer are smaller than a distance between each end in the first direction of the recess and the ground conductor layer.

3. The high-frequency board according to claim 2, wherein
a length in the first direction of the recess is larger than a length in the first direction of each of the first electrode pad and the second electrode pad.

4. The high-frequency board according to claim 2, further comprising:
a capacitor overlapping the recess;
a first bond joining the capacitor to the first line conductor; and
a second bond joining the capacitor to the second line conductor,
wherein a width in the second direction of the recess is smaller than a dimension of part of the capacitor which part is located on an upper surface of the first electrode pad and/or the second electrode pad and protrudes from an end in the second direction of the recess.

5. The high-frequency board according to claim 1, wherein
a second direction is perpendicular to the first direction, and
a width in the second direction of the recess is smaller than a distance between an end in the second direction of the recess and the ground conductor layer.

6. The high-frequency board according to claim 1, wherein
a shape of the recess is symmetrical with an imaginary line which passes through a center in a plan view of the recess and extends in the first direction.

7. The high-frequency board according to claim 1, further comprising:
a capacitor overlapping the recess;
a first bond joining the capacitor to the first line conductor; and
a second bond joining the capacitor to the second line conductor.

8. The high-frequency board according to claim 7, wherein
a dimension in the first direction of the recess is larger than a dimension in the first direction of the capacitor.

9. The high-frequency board according to claim 7, wherein
a distance in the first direction between the capacitor and the ground conductor layer is larger than a distance in the second direction between the capacitor and the ground conductor layer.

10. The high-frequency board according to claim 1, further comprising:
an other ground conductor layer overlapping the recess.

11. The high-frequency board according to claim 10, wherein
an upper surface of the other ground conductor layer at a position overlapping the recess is covered with a ceramic material.

12. The high-frequency board according to claim 1, wherein
the first line conductor comprises a plurality of first line conductors which are located in parallel with each other, and
parts of the ground conductor layer are located between the plurality of first line conductors.

13. The high-frequency board according to claim 1, wherein
the second line conductor comprises a plurality of second line conductors which are located in parallel with each other, and
parts of the ground conductor layer are located between the plurality of second line conductors.

14. A high-frequency package, comprising:
a board;
a frame located on an upper surface of the board; and
the high-frequency board according to claim 1, joined to the frame.

15. A high-frequency module, comprising:
the high-frequency package according to claim 14;
a semiconductor element mounted on the upper surface of the board; and
a lid joined to an upper edge of the frame and covering the high-frequency package.

16. The high-frequency board according to claim 1, wherein the recess includes a bottom surface.

17. The high-frequency board according to claim 16, wherein the first side of the recess and the second side of the recess are perpendicular to the bottom surface.

\* \* \* \* \*